United States Patent
Ayya et al.

(10) Patent No.: US 11,159,152 B1
(45) Date of Patent: Oct. 26, 2021

(54) DUTY CYCLE CORRECTOR AND CONVERTER FOR DIFFERENTIAL CLOCK SIGNALS

(71) Applicant: SYNAPTICS INCORPORATED, San Jose, CA (US)

(72) Inventors: Chandrashekhar Reddy Ayya, Hyderabad (IN); Srishti Garg, Hyderabad (IN)

(73) Assignee: SYNAPTICS INCORPORATED, San Jose, CA (US)

( * ) Notice: Subject to any disclaimer, the term of this patent is extended or adjusted under 35 U.S.C. 154(b) by 0 days.

(21) Appl. No.: 17/149,652

(22) Filed: Jan. 14, 2021

(30) Foreign Application Priority Data

Nov. 23, 2020 (IN) .............................. 202041050960

(51) Int. Cl.
*H03K 5/156* (2006.01)
*H03K 5/06* (2006.01)
*H03K 3/023* (2006.01)
*H03K 3/017* (2006.01)

(52) U.S. Cl.
CPC .......... *H03K 5/1565* (2013.01); *H03K 3/017* (2013.01); *H03K 3/023* (2013.01); *H03K 5/06* (2013.01)

(58) Field of Classification Search
None
See application file for complete search history.

(56) References Cited

U.S. PATENT DOCUMENTS

2007/0046351 A1* 3/2007 Minzoni ............... H03K 5/1565
327/175
2018/0219534 A1* 8/2018 Ray .......................... H03K 5/08

* cited by examiner

*Primary Examiner* — Cassandra F Cox
(74) *Attorney, Agent, or Firm* — Haynes and Boone, LLP

(57) ABSTRACT

Various techniques are provided to correct the duty cycles and convert differential clock signals in synchronized systems. In one example, a method includes receiving an input differential clock signal having a distorted duty cycle. The method also includes adjusting the input differential clock signal to provide an output differential clock signal with a corrected duty cycle. The adjusting is performed in response to signals provided by a differential amplifier and a common mode amplifier of an analog feedback circuit receiving the output differential clock signal. Additional methods and systems are also provided.

20 Claims, 9 Drawing Sheets

DUTY CYCLE CORRECTOR AND CONVERTER FOR DIFFERENTIAL CLOCK SIGNALS

CROSS-REFERENCE TO RELATED APPLICATIONS

This application claims priority to and the benefit of India Provisional Patent Application No. 202041050960 filed Nov. 23, 2020 and entitled "DUTY CYCLE CORRECTOR AND CONVERTER FOR DIFFERENTIAL CLOCK SIGNALS", which is hereby incorporated by reference in its entirety.

TECHNICAL FIELD

The present invention relates generally to clock signals and, more particularly, to maintaining clock signal duty cycles in high speed circuits.

BACKGROUND

High speed electronic circuits frequently rely on corresponding high speed clock signals to maintain synchronization and facilitate accurate data transfers. However, increased clock speeds can increase the possibility of clock signal errors.

For example, clock signals used for serializing and deserializing data typically rely on strict 50 percent duty cycles to provide appropriate setup and hold time margins for high speed applications that utilize both positive and negative edge transitions of the clock signals. Such applications include, for example, double-data-rate (DDR) synchronous dynamic random access memory (SDRAM), double sampling analog-to-digital converters (ADCs), and half rate clock and data recovery.

However, clock signals often pass from a clock generator through long routings (e.g., circuit traces and/or clock trees) before ultimately being received by a destination circuit to be synchronized. Such configurations can make the clock signals susceptible to duty cycle distortions caused by variations in process, voltage and temperature (PVT). As a result, distorted clock signals that deviate from the original 50 percent duty cycle may be received by the destination circuit. As clock speeds increase, these unintended changes in duty cycle can adversely affect the setup and hold times that may be required to synchronize the destination circuit.

SUMMARY

In accordance with embodiments set forth herein, various techniques are provided to correct the duty cycles and convert differential clock signals in synchronized systems.

In one embodiment, a method includes receiving an input differential clock signal having a distorted duty cycle; adjusting the input differential clock signal to provide an output differential clock signal with a corrected duty cycle; and wherein the adjusting is performed in response to signals provided by a differential amplifier and a common mode amplifier of an analog feedback circuit receiving the output differential clock signal.

In another embodiment, a system includes a converter circuit configured to adjust an input differential clock signal having a distorted duty cycle to provide an output differential clock signal with a corrected duty cycle; an analog feedback circuit configured to receive the output differential clock signal, the feedback circuit comprising a differential amplifier and a common mode amplifier; and wherein the converter circuit is configured to adjust the input differential clock signal in response to signals provided by the differential amplifier and the common mode amplifier.

The scope of the invention is defined by the claims, which are incorporated into this section by reference. A more complete understanding of embodiments of the present invention will be afforded to those skilled in the art, as well as a realization of additional advantages thereof, by a consideration of the following detailed description of one or more embodiments. Reference will be made to the appended sheets of drawings that will first be described briefly.

BRIEF DESCRIPTION OF THE DRAWINGS

Embodiments of the present invention and their advantages are best understood by referring to the detailed description that follows. It should be appreciated that like reference numerals are used to identify like elements illustrated in one or more of the figures.

DETAILED DESCRIPTION

In accordance with various embodiments, systems and methods are provided to adjust (e.g., correct) differential clock signals used to synchronize high speed circuits (e.g., greater than 10 gigabits per second (Gbps) in some embodiments). In some embodiments, a clock correction circuit may be provided that adjusts the duty cycle of a differential clock signal. In some embodiments, the clock correction circuit may further convert a CML clock signal to an CMOS clock signal to facilitate interfacing synchronized high speed circuits with upstream circuit paths (e.g., circuit traces and/or clock trees).

In some embodiments, various advantages may be provided over conventional clock circuit implementations. For example, in some embodiments, the clock correction circuit may be implemented as a fully differential circuit with high accuracy that reduces jitter in the clock path due to a high power supply rejection ratio (PSRR) and a high common mode rejection ratio (CMRR). In some embodiments, the clock correction circuit may further convert a CML clock signal to a CMOS clock signal without degrading power supply rejection (PSR), in contrast with conventional circuits that are generally limited to CML output clock signals.

In some embodiments, alternating current (AC) coupling capacitors are provided upstream of a feedback circuit of the clock correction circuit (e.g., which helps optimize gain of CML input buffers for high speed designs), in contrast with conventional circuits that typically provide a feedback path directly from input buffers. In some embodiments, power savings may be achieved by not requiring extra current for duty cycle correction in a CML buffer stage of the clock correction circuit.

Figure 1:
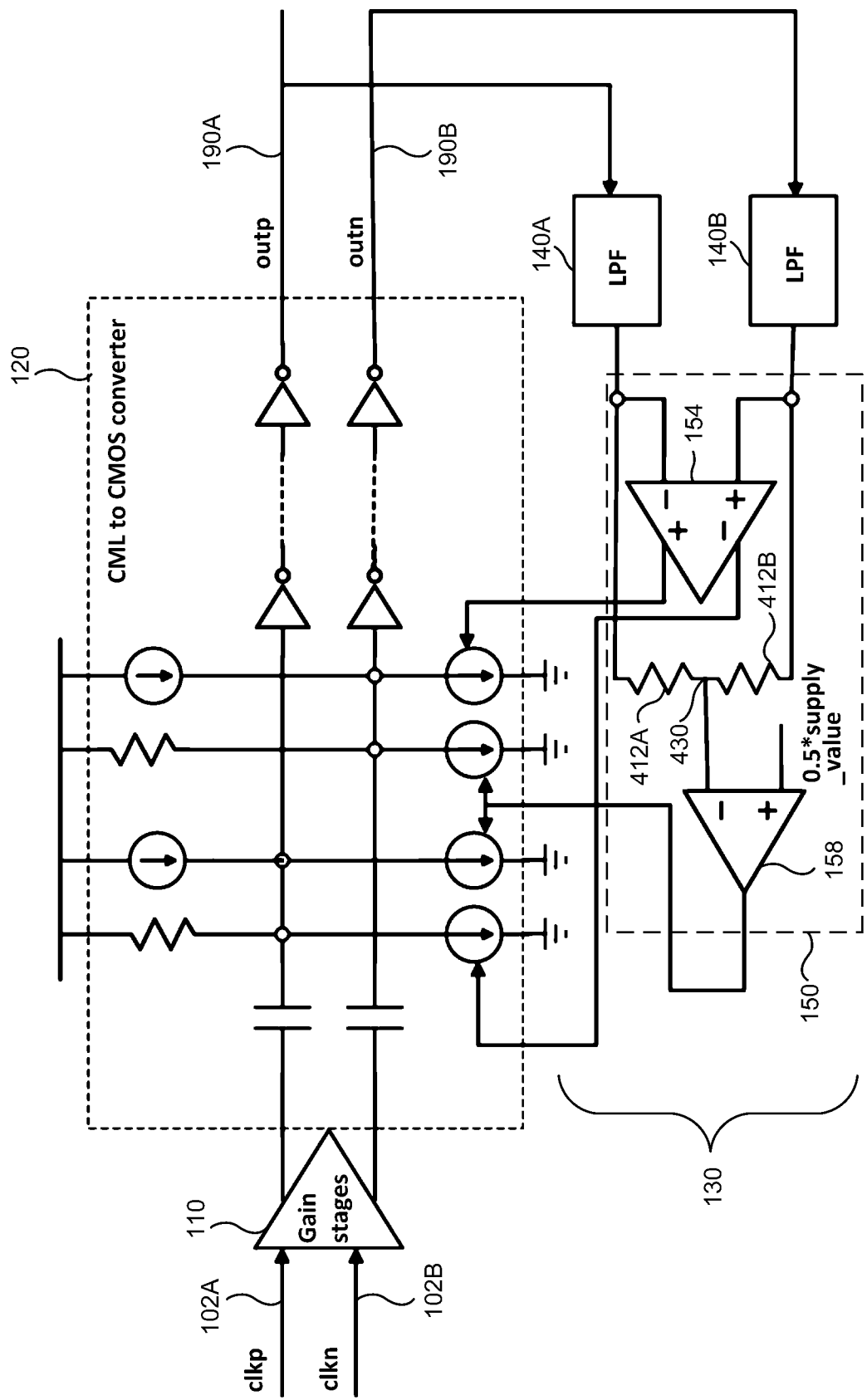
FIG. 1 illustrates a clock correction circuit in accordance with an embodiment of the disclosure.

Turning now to the drawings, FIG. 1 illustrates a clock correction circuit 100 in accordance with an embodiment of the disclosure. Clock correction circuit 100 receives an input differential clock signal at nodes 102A-B (e.g., also referred to as input ports and labeled clkp and clkn respectively) and provides an output differential clock signal passed by output ports 190A and 190B (labeled outp and outn respectively).

In some embodiments, the input differential clock signal may be a differential CML clock signal having a duty cycle that varies from a preferred 50 percent duty cycle. As discussed, such variance may occur as a result of PVT effects on the input clock signal as it is passed from a clock generator through various circuit paths before being received by clock correction circuit 100. In some embodiments, clock correction circuit 100 processes the differential CML clock signal to provide the output clock signal as a CMOS clock signal having a corrected duty cycle of 50 percent or approximately 50 percent.

As shown, clock correction circuit 100 includes a gain stage circuit 110, a CML to CMOS converter circuit 120, and an analog feedback circuit 130. As also shown, feedback circuit 130 includes low pass filter circuits 140A-B and a duty cycle adjustment circuit 150. As further shown, duty cycle adjustment circuit 150 provides two feedback return paths, namely, a differential feedback return path including a differential amplifier circuit 154 and a common mode feedback return path including a common mode amplifier circuit 158.

Figure 2:
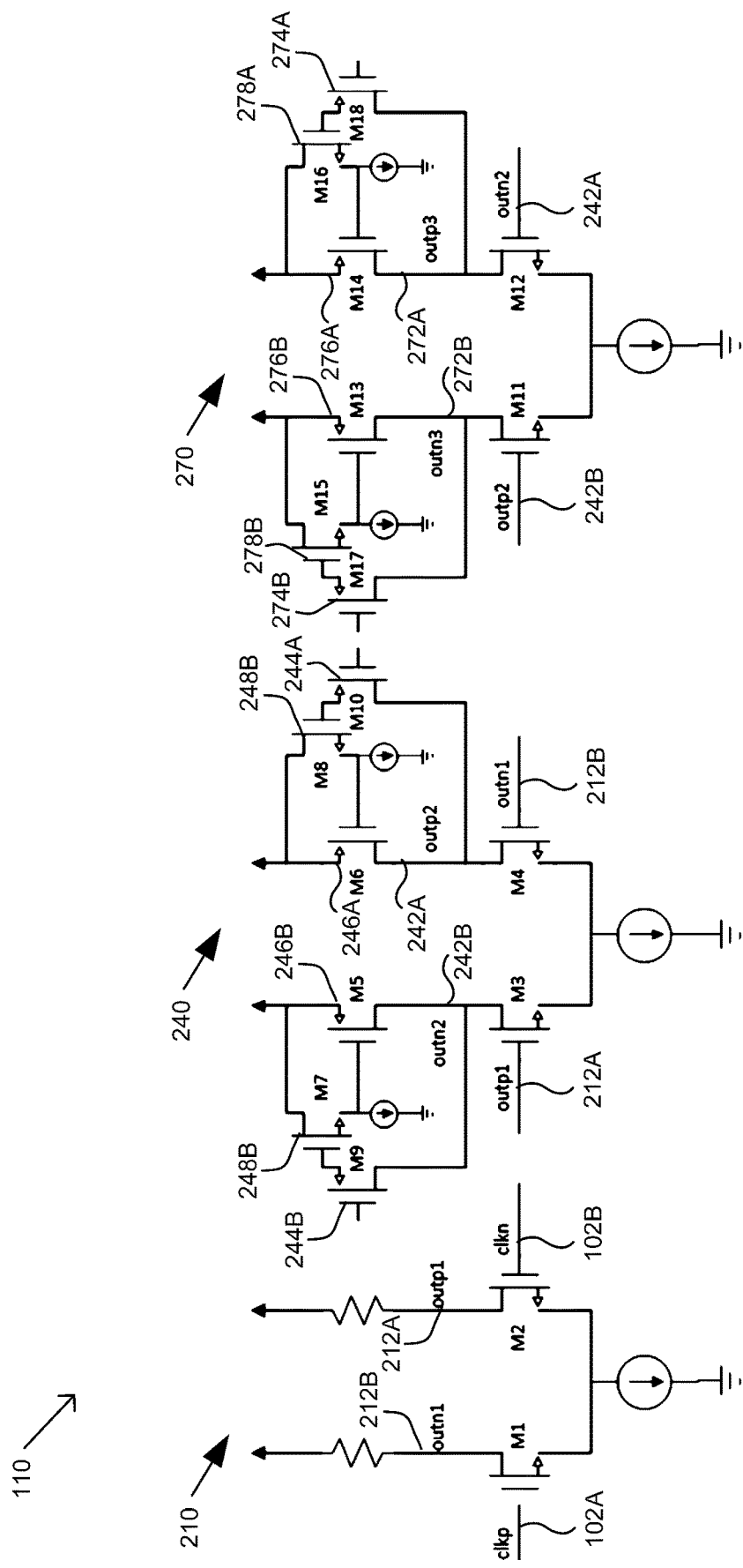
FIG. 2 illustrates a gain stage circuit in accordance with an embodiment of the disclosure.

FIG. 2 illustrates further details of gain stage circuit 110 in accordance with an embodiment of the disclosure. Gain stage circuit 110 operates to amplify the differential CML clock signal received at nodes 102A-B to provide sufficient voltage swing to convert the differential CML clock signal to a CMOS clock signal. In particular, gain stage circuit 110 includes a buffer circuit 210, a first active inductor stage circuit 240, and a second active inductor stage circuit 270.

Buffer circuit 210 is a resistor load differential buffer that receives the differential CML clock signal at nodes 102A-B and provides a buffered differential CML clock signal having an appropriate common mode voltage at nodes 212A-B (labeled outp1 and outn1).

First active inductor stage circuit 240 receives the buffered differential CML clock signal and amplifies it to provide a first amplified differential CML clock signal at nodes 242A-B (labeled outp2 and outn2). As shown, first active inductor stage circuit 240 further includes transistors 244A-B (e.g., labeled M10 and M9 operating in the deep-triode region) through which nodes 242A-B are coupled to the gates of PMOS transistors 246A-B (labeled M6 and M5) via source follower transistors 248A-B (labeled M8 and M7), respectively. By adjusting the gate voltages of transistors 244A-B (e.g., through appropriate control signals provided by control circuit 830 of FIG. 8), they operate as variable resistors. As a result, the inductance exhibited by first active inductor stage circuit 240 will be correspondingly adjusted to affect the gain (e.g., amplification) of first active inductor stage circuit 240 exhibited at different frequencies.

Figure 6:
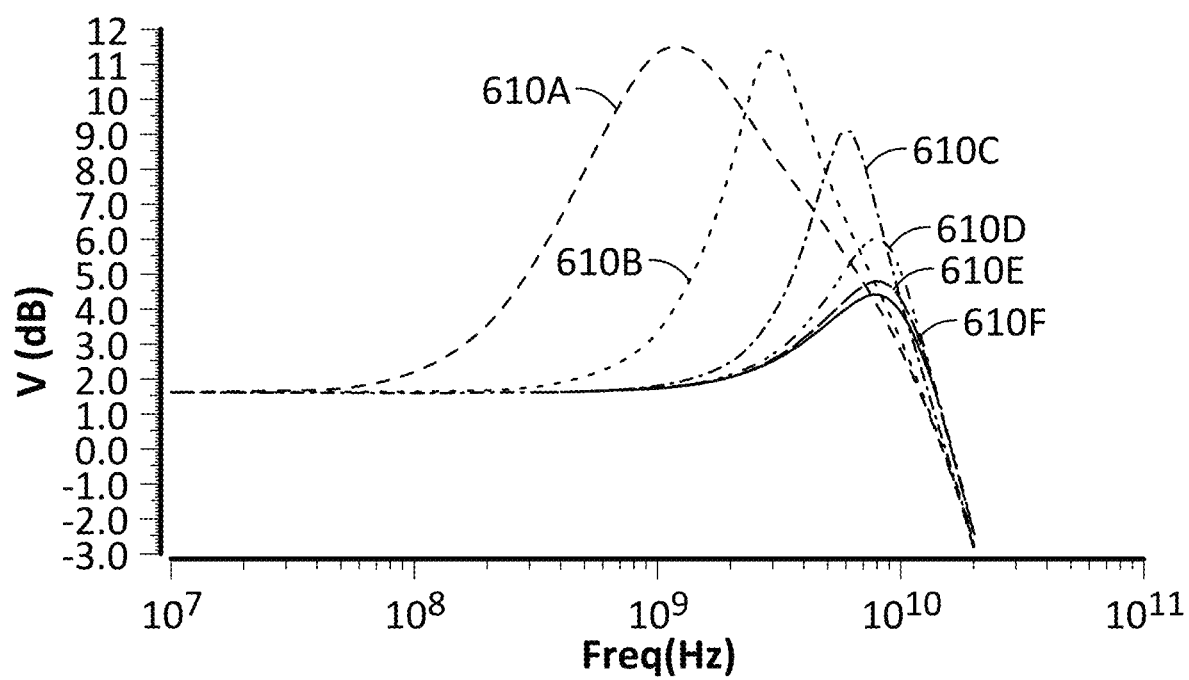
FIG. 6 illustrates plots of the gain applied by an active inductor stage circuit in accordance with an embodiment of the disclosure.

For example, FIG. 6 illustrates plots 610A-F of the gain applied by first active inductor stage circuit 240 of FIG. 2B over a range of frequencies as different voltages are applied to transistors 244A-B in accordance with an embodiment of the disclosure. The amplification exhibited by plots 610A-F at different frequencies can be adjusted (e.g., tuned) in response to associated voltages applied to the control gates of transistors 244A-B to provide desired amplification for different clock frequencies as appropriate. In FIG. 6, plots 610A-F are associated with gate voltages of 0.5 volts, 0.4 volts, 0.3 volts, 0.2 volts, 0.1 volts, and 0.0 volts, respectively. As shown, such a configuration permits amplification across a range of high frequencies (e.g., from less than $10^9$ Hz to greater than $10^{10}$ Hz).

First and second active inductor stage circuits 240 and 270 may be implemented in a cascaded configuration as shown in FIG. 2. Second active inductor stage circuit 270 receives the first amplified differential CML clock signal and further amplifies it to provide a second amplified differential CML clock signal at nodes 272A-B (labeled outp3 and outn3). As shown, second active inductor stage circuit 240 further includes transistors 274A-B (labeled M18 and M17), 276A-B (labeled M14 and M13), and 278A-B (labeled M16 and M15) operating in a similar manner as discussed with regard to corresponding features of first active inductor stage circuit 240.

Figure 3:
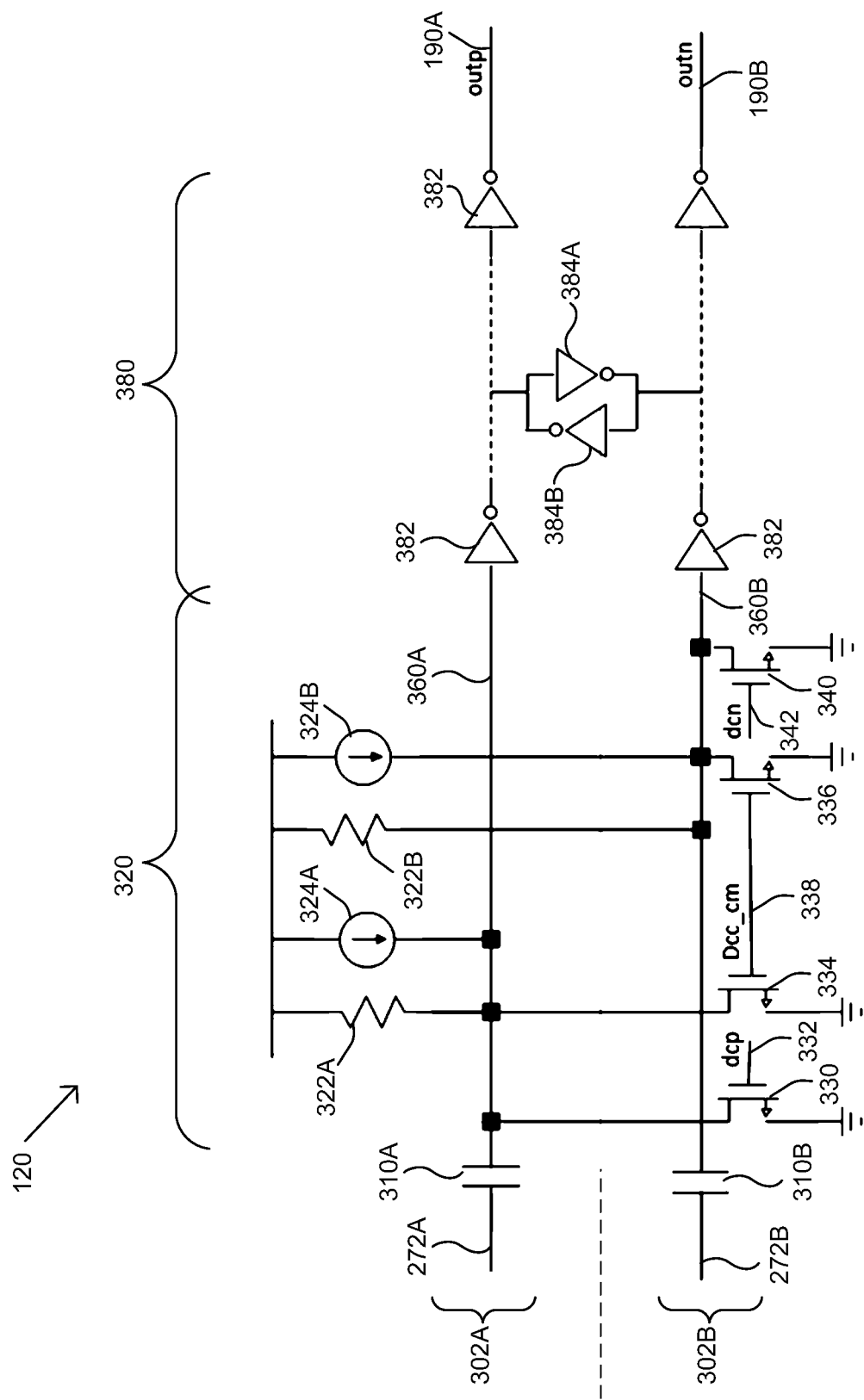
FIG. 3 illustrates a current mode logic (CML) to complementary metal oxide semiconductor (CMOS) converter circuit in accordance with an embodiment of the disclosure.

FIG. 3 illustrates further details of CML to CMOS converter circuit 120 in accordance with an embodiment of the disclosure. As shown, converter circuit 120 includes coupling capacitors 310A and 310B, an adjustment stage 320, and an inverter stage 380. As also shown, converter circuit 120 provides a fully differential circuit path comprising circuit path 302A (e.g., also referred to as a PMOS circuit path) and circuit path 302B (e.g., also referred to as an NMOS circuit path) to carry the complementary signals of a differential clock signal.

Capacitors 310A-B receive the second amplified differential CML clock signal from nodes 272A-B of second active inductor stage circuit 240. Capacitors 310A-B operate to filter out common mode voltage in the second amplified differential CML clock signal upstream of return paths of feedback circuit 130 to provide a filtered CML clock signal.

Adjustment stage 320 receives and adjusts the filtered clock signal to provide a corrected CMOS clock signal to nodes 360A-B having an adjusted common mode voltage and a corrected duty cycle. In this regard, the common mode voltage and duty cycle of circuit path 302A is set by a resistor 322A, a current source 324A, a transistor 330 (e.g., in response to a signal provided to node 332 from differential amplifier circuit 154), and a transistor 334 (e.g., in response to a signal provided to node 338 (e.g., connected to shared gates of transistors 334 and 336) by common mode amplifier circuit 158. The common mode voltage and duty cycle of circuit path 302B is set by a resistor 322B, a current source 324B, a transistor 340 (e.g., in response to a signal provided to node 342 from differential amplifier circuit 154), and a transistor 336 (e.g., in response to the signal provided to node 338 by common mode amplifier circuit 158).

Adjustment stage 320 adjusts the duty cycle of the differential clock signal in response to signals provided by a common mode loop and a differential loop of feedback circuit 130. In this regard, the common mode loop including common mode amplifier circuit 158 provides a common mode feedback signal to node 338 feeding the gates of transistors 334 and 336. The differential loop including differential mode amplifier circuit 154 provides differential feedback signals to nodes 332 and 342 feeding the gates of transistors 330 and 340. Transistors 330 and 334 adjust the current flowing through resistor 322A to provide the correct bias voltage to node 360A, while transistors 336 and 340 adjust the current flowing through resistor 322B to provide the correct bias voltage to node 360B such that duty cycle at output nodes 190A and 190B is 50 percent. Current sources 324A and 324B provide duty cycle correction in both directions.

Inverter stage 380 receives the corrected differential CMOS clock signal and passes it through a plurality of inverters 382 disposed in circuit paths 302A-B between nodes 360A-B and output nodes 190A-B to provide a buffer between adjustment stage 320 and output nodes 190A-B. Inverter stage 380 further includes cross-coupled inverters 384A-B that operate to reduce skew in the corrected CMOS clock signal.

Referring again to FIG. 1, as discussed, clock correction circuit 100 includes a feedback circuit 130 that includes low pass filter circuits 140A-B and duty cycle adjustment circuit 150. As shown in FIG. 1, the corrected differential CMOS clock signal provided to output nodes 190A-B is passed back through feedback circuit 130 to facilitate duty cycle adjustment. In particular, the corrected differential CMOS clock signal is initially passed to low pass filter circuits 140A-B for feedback circuit 130.

Figure 4:
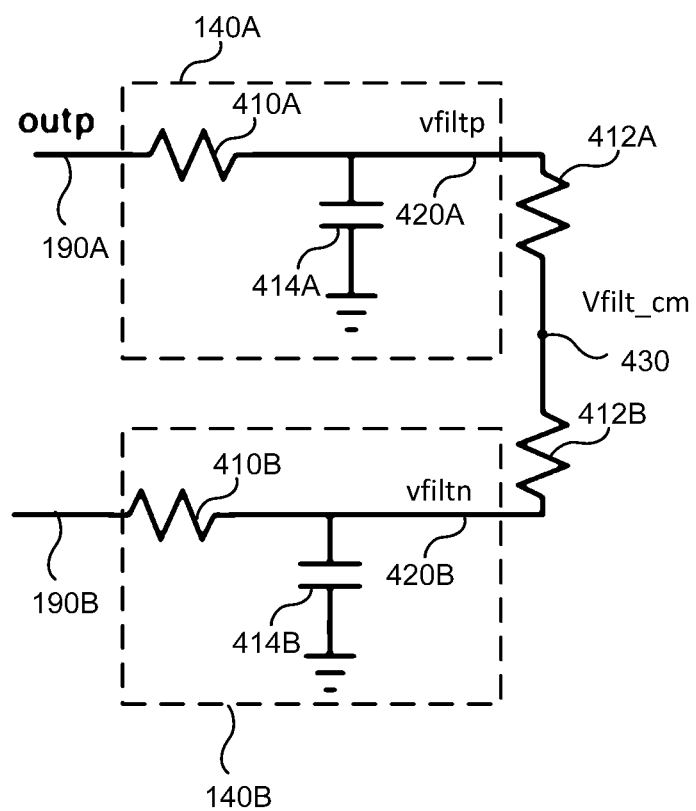
FIG. 4 illustrates low pass filter circuits in accordance with an embodiment of the disclosure.

FIG. 4 illustrates low pass filter circuits 140A and 140B in accordance with an embodiment of the disclosure. Low pass filter circuit 140A includes a resistor 410A and a capacitor 414A which operate as an RC circuit to perform low pass filtering on the PMOS circuit path complement of the corrected differential CMOS clock signal to provide an average voltage (e.g., as a result of the transient response time of the RC circuit determined by the values of resistor 410A and capacitor 414A) of the PMOS complement at node 420A (labeled vfiltp).

Similarly, low pass filter circuit 140B includes a resistor 410B and a capacitor 414B which operate as an RC circuit to perform low pass filtering on the NMOS circuit path complement of the corrected differential CMOS clock signal to provide an average voltage (e.g., as a result of the transient response time of the RC circuit determined by the values of resistor 410B and capacitor 414B) of the NMOS complement at node 420B (labeled vfiltn).

In some embodiments, a difference in the average voltages at nodes 420A-B may indicate a duty cycle error between the two clock complements that differs from a desired 50 percent duty cycle. The voltages of nodes 420A-B are provided to differential amplifier circuit 154 to correct the duty cycle as further discussed herein.

As further shown in FIGS. 1 and 4, low pass filter circuits 140A-B are connected to resistors 412A-B to provide an average of the voltages of nodes 420A-B at a node 430 (labeled Vfilt_cm). In this regard, a voltage at node 430 that differs from an expected 50 percent average (e.g., different from 50 percent of a supply voltage), may indicate a differential duty cycle error between the complementary signals of the differential clock signal. Accordingly, the voltage of node 430 may be provided to common mode amplifier circuit 158 to correct differential duty cycle error as further discussed herein.

Figure 5:
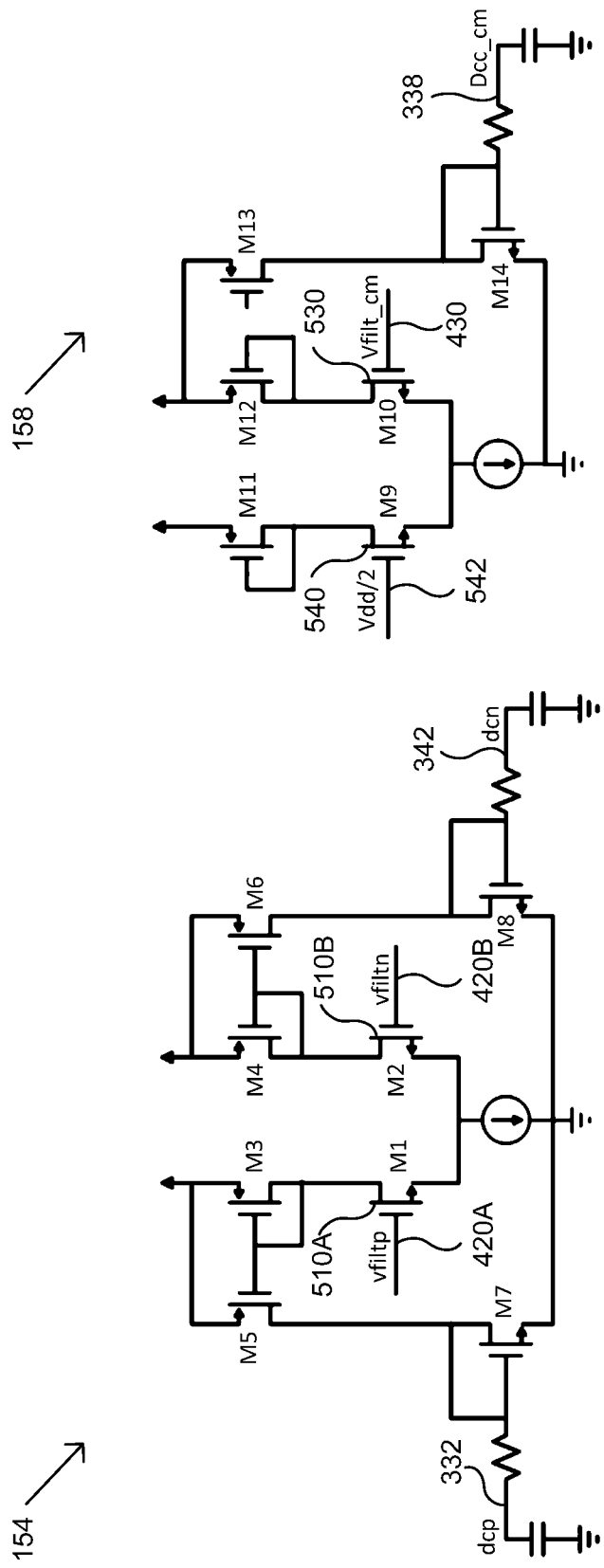
FIG. 5A illustrates a differential amplifier circuit in accordance with an embodiment of the disclosure.
FIG. 5B illustrates a common mode amplifier circuit in accordance with an embodiment of the disclosure.

FIG. 5A illustrates differential amplifier circuit 154 in accordance with an embodiment of the disclosure. As shown, the average voltages of nodes 420A and 420B are provided to the gates of transistors 510A and 510B. It will be appreciated that differences in the voltages at nodes of nodes 420A and 420B will cause the voltages of nodes 332 (dcp) and 342 (dcn) to be pulled up or down inversely (e.g., adjusted in opposite amounts). For example, if node 420A exhibits a higher voltage than node 420B (e.g., associated with the PMOS circuit path clock signal complement exhibiting a longer duty cycle than the NMOS circuit path clock signal complement), then node 332 (dcp) will be pulled to a lower voltage than node 342 (dcn). As a result, when the voltages of nodes 332 and 342 are applied to the gates of transistors 330 and 340 of converter circuit 120, transistor 340 will pass more current from resistor 322B than transistor 330 passes from resistor 322A to adjust the duty cycle. It will be appreciated that these operations can be reversed if node 420A exhibits a lower voltage than node 420B.

By continuously adjusting the voltages provided to nodes 332 and 342, the complementary signals of the differential clock signal at nodes 360A-B can be adjusted to maintain duty cycles equal to each other such that the duty cycle error difference between output nodes 190-A is equal to or approaches zero.

FIG. 5B illustrates common mode amplifier circuit 158 in accordance with an embodiment of the disclosure. As shown, the voltage of node 430 (e.g., corresponding to an average of the voltages of nodes 420A and 420B) is provided to the gate of a transistor 530 while a fixed voltage (e.g., half a supply voltage labeled Vdd/2) is provided to node 542 corresponding to the gate of transistor 540.

As discussed, a voltage at node 430 that differs from an expected 50 percent average may indicate a differential duty cycle error between the complementary signals of the differential clock signal. Accordingly, if the voltage of node 430 varies from the fixed voltage of node 542, this will result in changes in the voltage of node 338 provided to transistors 334 and 336 of converter circuit 120. In this regard, as the voltage at node 338 changes, transistors 334 and 336 will pass currents equally from resistors 322A and 322B to adjust the duty cycle.

By continuously adjusting the voltage provided to node 430, the duty cycles of the complementary signals of the differential clock signal can be adjusted to exhibit an average duty cycle equal to or approaching 50 percent such that the differential clock signal exhibits a duty cycle equal to or approximately 50 percent.

Figure 7:
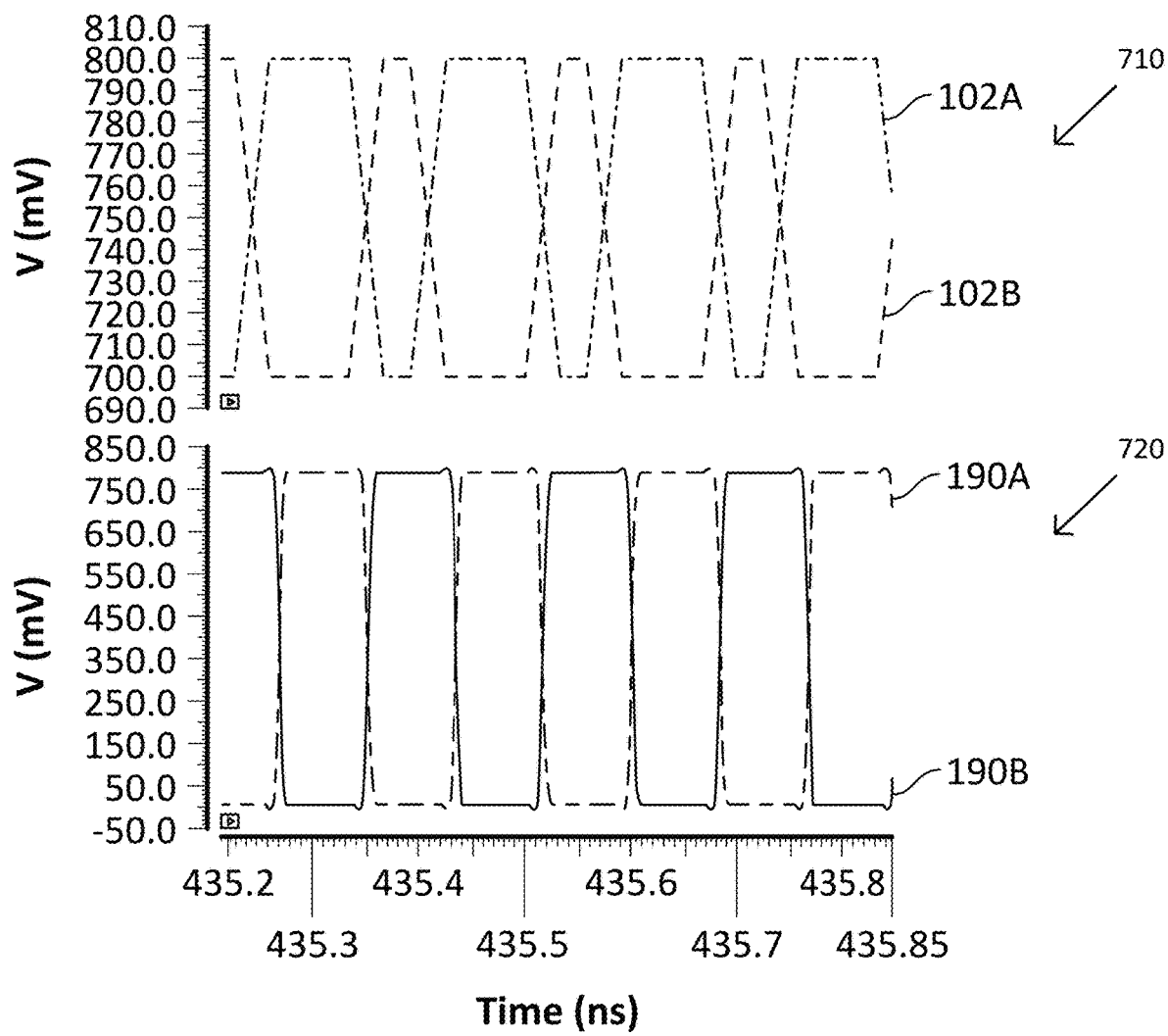
FIG. 7 illustrates distorted and corrected clock signals in accordance with an embodiment of the disclosure.

FIG. 7 illustrates plots 710 and 720 of distorted and corrected clock signals in accordance with an embodiment of the disclosure. Plot 710 illustrates the complements of the differential CML clock signal received at nodes 102A and 102B. As shown, the complements in plot 710 exhibit substantial distortion (e.g., deviation from a desired 50 percent duty cycle) with a duty cycle of approximately 35 percent.

Plot 720 illustrates the complements of the corrected differential CMOS clock signal provided at output nodes 190A-B. As shown, the complements in plot 720 have been corrected with output nodes 190A-B each exhibiting a duty cycle of approximately 50 percent.

Clock correction circuit 100 may be implemented in various host systems as appropriate, such as logic devices, consumer electronics devices, and/or other systems. For example, FIG. 8 illustrates a host system 800 comprising clock correction circuit 100 of FIG. 1 and additional components in accordance with an embodiment of the disclosure.

A clock generator 810 (e.g., a phase lock loop (PLL) or other appropriate circuit) provides a CML differential clock signal to be used for synchronizing a destination circuit 840 (e.g., a synchronized circuit such as a serializer/deserializer (SerDes) circuit and/or other types of circuits as appropriate). When initially provided to nodes 812A-B, the CML differential clock signal may exhibit a duty cycle of 50 percent as shown in FIG. 8. However, as the CML differential clock signal is distributed through various circuit paths 820 (e.g., circuit traces, clock trees, and/or other circuits providing clock distribution circuit paths) on its way to destination circuit 840, it may exhibit changes in its duty cycle caused by PVT variations introduced as the CML differential clock signal passes through circuit paths 820. As a result, when the CML differential clock signal is ultimately received at nodes 102A-B of clock correction circuit 100, it may exhibit duty cycle distortion as shown in FIG. 8 and also similarly discussed with regard to plot 710 of FIG. 7.

Clock correction circuit 100 may operate to convert the CML differential clock signal to a CMOS clock signal and also adjust its duty cycle as discussed. As also shown, one or more control circuits 830 (e.g., implemented by associated logic circuits, microcontrollers, processors, and/or other circuitry) may be used to provide control signals to clock correction circuit 100 to facilitate such operation as appropriate. As a result, clock correction circuit 100 provides a corrected CMOS differential clock signal to output nodes 190A-B for use by destination circuit 840.

Figure 8:
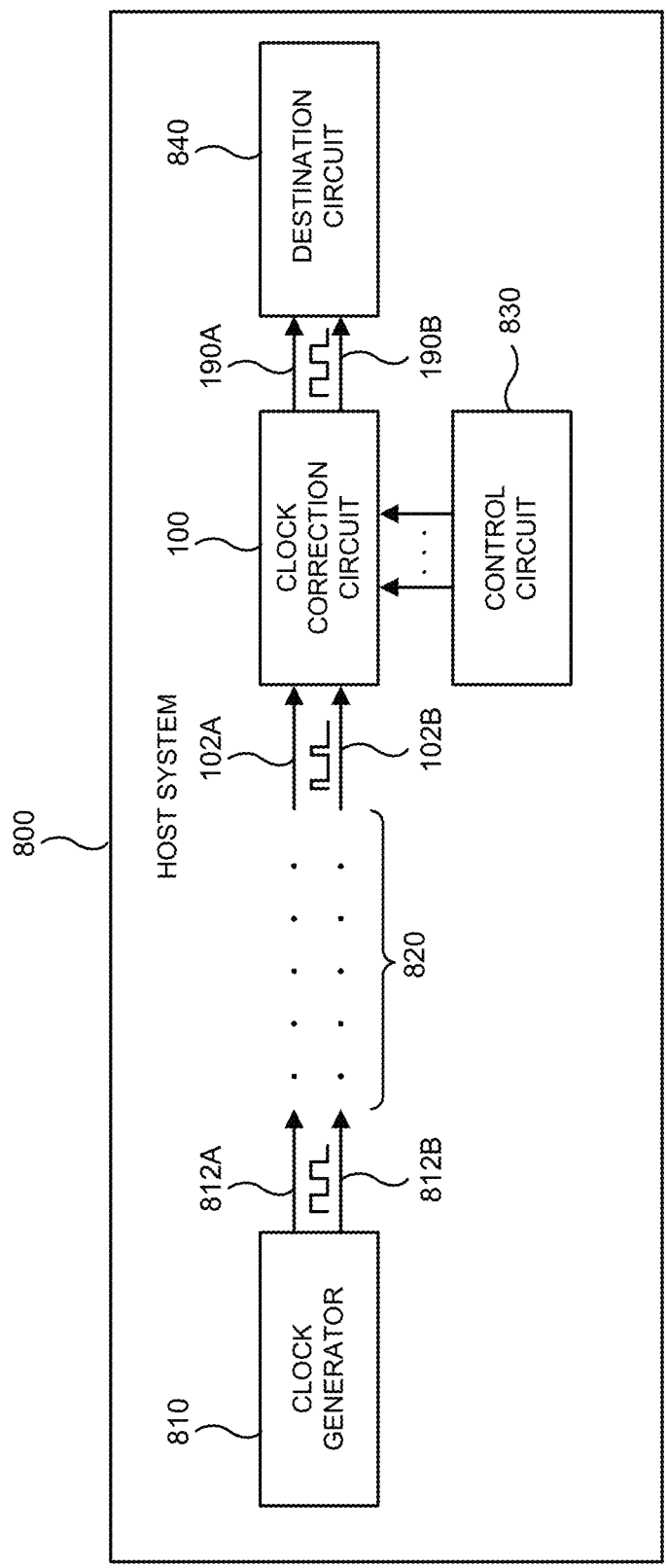
FIG. 8 illustrates a host system comprising the clock correction circuit of FIG. 1 in accordance with an embodiment of the disclosure.
Figure 9:
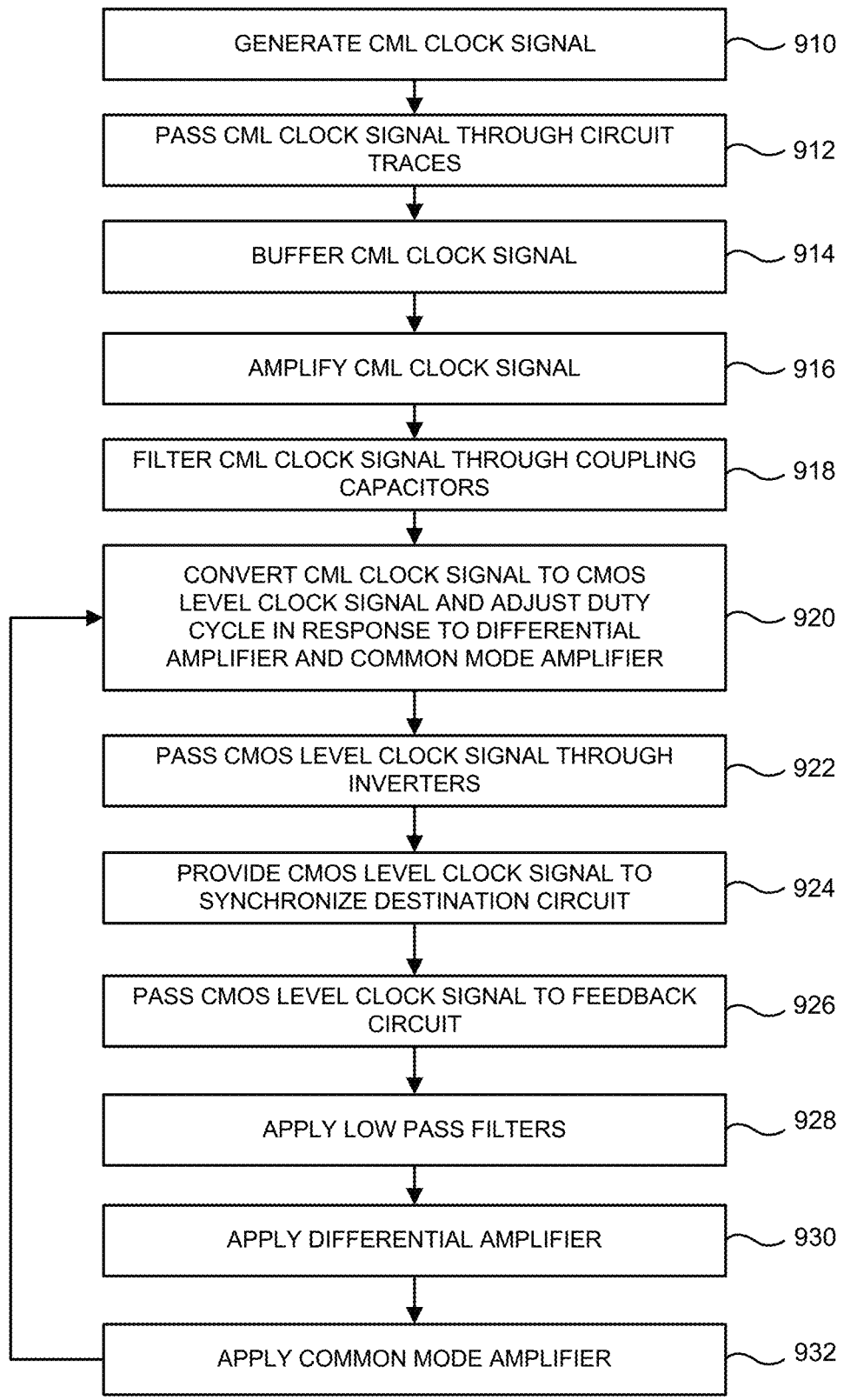
FIG. 9 illustrates a process performed by the clock correction circuit of FIG. 1 and the host system of FIG. 8 in accordance with an embodiment of the disclosure.

FIG. 9 illustrates a process performed by clock correction circuit 100 of FIG. 1 and host system 800 of FIG. 8 in accordance with an embodiment of the disclosure. It will be appreciated that the process of FIG. 9 may be performed in accordance with the various principles discussed herein with regard to FIGS. 1 to 8.

In block 910, clock generator 810 generates a differential CML clock signal that is provided to nodes 812A and 812B. In block 912, the differential CML clock signal passes through one or more circuit paths 820 to nodes 102A and 102B of clock correction circuit 100.

In block 914, the differential CML clock signal is buffered by buffer circuit 210. In block 916, the buffered differential CML clock signal is amplified by first and second active inductor stage circuits 240 and 270. In some embodiments, the amplification may be adjusted to operate over a desired frequency range (e.g., as discussed with regard to FIG. 6) to accommodate high speed clock signals.

In block 918, the amplified differential CML clock signal is filtered by coupling capacitors 310A-B. In block 920, adjustment stage 320 operates to convert the amplified differential CML clock signal to a differential CMOS clock signal. Also in block 920, adjustment stage operates to adjust the duty cycle of the differential CMOS clock signal as discussed. In block 922, the differential CMOS clock signal is passed through inverter stage 380.

In block 924, the differential CMOS clock signal is provided to destination circuit 840 at output nodes 190A-B (e.g., a corrected differential clock signal). Accordingly, it will be appreciated that block 924 may also include synchronizing destination circuit 840 using the differential CMOS clock signal such that destination circuit 840 is effectively synchronized with the original CML clock signal provided by clock generator 810.

In blocks 926 to 932, the differential CMOS clock signal is processed by feedback circuit 130 to provide appropriate adjustment signals (e.g., voltages) to perform the duty cycle adjustment of block 920. Accordingly, in block 926, the differential CMOS clock signal is passed to feedback circuit 130.

In block 928, the differential CMOS clock signal is filtered by low pass filter circuits 140A-B. In block 930, differential amplifier circuit 154 operates to adjust the duty cycle of the differential CMOS clock signal as discussed. In block 932, common mode amplifier circuit 158 operates to adjust the duty cycle of the differential CMOS clock signal as discussed.

Following block 932, the process returns to block 920 where the duty cycle of the differential CMOS clock signal continues to be corrected in realtime through successive iterations of blocks 920 to 932.

In view of the present disclosure, it will be appreciated that clock correction circuit 100 may be used to adjust the duty cycle of differential clock signals in high speed systems with clock speeds in excess of 10 GHz. For example, by feeding back the corrected differential CMOS clock signal after gain stage circuit 110, buffer circuit 210 may be implemented to operate on high speed differential CML clock signals. In addition, by implementing clock correction circuit 100 with a fully differential circuit path, jitter associated with power supply can be reduced. Moreover, as discussed, clock correction circuit 100 permits differential CML clock signals to be converted to CMOS clock signals at high speeds.

In addition, by implementing feedback path 130 as analog circuit, the duty cycle adjustment signals provided to nodes 332, 338, and 342 may be continuously adjusted with high precision to perform common mode and differential duty cycle adjustments to the complementary signals of the differential clock signal to provide a desired 50 percent duty cycle for the differential clock signal. This provides improved precision and accuracy in adjusting and maintaining the duty cycle in contrast to conventional digital systems that rely on the sizing of inverters and related capacitive loading to maintain duty cycles.

Where applicable, various embodiments provided by the present disclosure can be implemented using hardware, software, or combinations of hardware and software. Also where applicable, the various hardware components and/or software components set forth herein can be combined into composite components comprising software, hardware, and/or both without departing from the spirit of the present disclosure. Where applicable, the various hardware components and/or software components set forth herein can be separated into sub-components comprising software, hardware, or both without departing from the spirit of the present disclosure. In addition, where applicable, it is contemplated that software components can be implemented as hardware components, and vice-versa. Embodiments described above illustrate but do not limit the invention. It should also be understood that numerous modifications and variations are possible in accordance with the principles of the present invention. Accordingly, the scope of the invention is defined only by the following claims.

What is claimed is:

1. A method comprising:
  receiving an input differential clock signal having a distorted duty cycle;
  adjusting the input differential clock signal to provide an output differential clock signal with a corrected duty cycle; and
  wherein the adjusting is performed in response to signals provided by a differential amplifier and a common mode amplifier of an analog feedback circuit receiving the output differential clock signal.

2. The method of claim 1, wherein:
  the input differential clock signal is a current mode logic (CML) clock signal;
  the output differential clock signal is a complementary metal oxide semiconductor (CMOS) clock signal; and the method further comprises converting the CML clock signal to the CMOS clock signal during the adjusting.

3. The method of claim 1, further comprising filtering the input differential clock signal to remove a common mode voltage upstream of return paths associated with the differential amplifier and the common mode amplifier of the feedback circuit.

4. The method of claim 3, further comprising:
adjusting an amplifier to provide a gain over a frequency range associated with the input differential clock signal; and
amplifying the input differential clock signal after the filtering and before the adjusting.

5. The method of claim 1, wherein the method is performed by a clock correction circuit comprising a fully differential circuit path comprising first and second complementary circuit paths between input nodes receiving the input differential clock signal and output nodes providing the output differential clock signal.

6. The method of claim 5, wherein the adjusting comprises operating the differential amplifier to inversely adjust currents passed from the first and second complementary circuit paths to maintain first and second complementary signals of the differential clock signal at equal duty cycles.

7. The method of claim 5, wherein the adjusting comprises operating the common mode amplifier to equally adjust currents passed from the first and second complementary circuit paths to maintain first and second complementary signals of the differential clock signal at 50 percent duty cycles.

8. The method of claim 5, wherein the clock correction circuit further comprises cross-coupled inverters connected between the first and second complementary circuit paths to reduce skew in the output differential clock signal.

9. The method of claim 1, further comprising:
generating the input differential clock signal by a clock generator of a host device;
passing the input differential clock signal from the clock generator over a clock distribution circuit path of the host device, wherein the distorted duty cycle is introduced into the input differential clock signal during the passing; and
synchronizing a destination circuit of the host device using the output differential clock signal.

10. The method of claim 1, wherein:
the corrected duty cycle is approximately a 50 percent duty cycle; and
the input differential clock signal and the output differential clock signal operate in excess of 10 GHz.

11. A system comprising:
a converter circuit configured to adjust an input differential clock signal having a distorted duty cycle to provide an output differential clock signal with a corrected duty cycle;
an analog feedback circuit configured to receive the output differential clock signal, the feedback circuit comprising a differential amplifier and a common mode amplifier; and
wherein the converter circuit is configured to adjust the input differential clock signal in response to signals provided by the differential amplifier and the common mode amplifier.

12. The system of claim 11, wherein:
the input differential clock signal is a current mode logic (CML) clock signal;
the output differential clock signal is a complementary metal oxide semiconductor (CMOS) clock signal; and
wherein the converter circuit is configured to convert the CML clock signal to the CMOS clock signal during while the input differential clock signal is adjusted.

13. The system of claim 11, further comprising a plurality of capacitors configured to filter the input differential clock signal to remove a common mode voltage upstream of return paths associated with the differential amplifier and the common mode amplifier of the feedback circuit.

14. The system of claim 13, further comprising:
an amplifier connected between the capacitors and the converter circuit and configured to provide a gain over a frequency range associated with the input differential clock signal.

15. The system of claim 11, wherein the converter circuit is implemented as part of a clock correction circuit comprising a fully differential circuit path comprising first and second complementary circuit paths between input nodes configured to receive the input differential clock signal and output nodes configured to pass the output differential clock signal.

16. The system of claim 15, wherein the differential amplifier is configured to inversely adjust currents passed from the first and second complementary circuit paths to maintain first and second complementary signals of the differential clock signal at equal duty cycles.

17. The system of claim 15, wherein the common mode amplifier is configured to equally adjust currents passed from the first and second complementary circuit paths to maintain first and second complementary signals of the differential clock signal at 50 percent duty cycles.

18. The system of claim 15, wherein the clock correction circuit further comprises cross-coupled inverters connected between the first and second complementary circuit paths to reduce skew in the output differential clock signal.

19. The system of claim 11, wherein the system is a host device further comprising:
a clock generator configured to generate the input differential clock signal;
a clock distribution circuit path configured to pass the input differential clock signal, wherein the distorted duty cycle is introduced into the input differential clock signal as it is passed by the clock distribution circuit path; and
a destination circuit configured to be synchronized by the output differential clock signal.

20. The system of claim 11, wherein:
the corrected duty cycle is approximately a 50 percent duty cycle; and
the input differential clock signal and the output differential clock signal operate in excess of 10 GHz.

* * * * *